(12) United States Patent
Marple et al.

(10) Patent No.: US 6,534,991 B2
(45) Date of Patent: *Mar. 18, 2003

(54) CONNECTION TESTER FOR AN ELECTRONIC TRIP UNIT

(75) Inventors: James Arthur Marple, Newtown, CT (US); Michael Roger Koller, Columbia City, IN (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/063,785

(22) Filed: May 13, 2002

(65) Prior Publication Data

US 2002/0121900 A1 Sep. 5, 2002

Related U.S. Application Data

(63) Continuation of application No. 09/521,493, filed on Mar. 9, 2000, now Pat. No. 6,429,659.

(51) Int. Cl.⁷ .................. G01R 31/02; G01N 27/42; H02H 3/00
(52) U.S. Cl. .................. 324/424; 324/415; 361/6; 361/92; 361/96; 361/94
(58) Field of Search ................ 324/415–424; 361/6, 92, 101, 102, 114, 94, 96

(56) References Cited

U.S. PATENT DOCUMENTS

| | | | |
|---|---|---|---|
| 2,340,682 A | 2/1944 | Powell | 200/147 |
| 2,719,203 A | 9/1955 | Gelzheiser et al. | 200/144 |
| 2,937,254 A | 5/1960 | Ericson | 200/114 |
| 3,158,717 A | 11/1964 | Jencks et al. | 200/116 |
| 3,162,739 A | 12/1964 | Klein et al. | 200/88 |
| 3,197,582 A | 7/1965 | Norden | 200/50 |
| 3,307,002 A | 2/1967 | Cooper | 200/116 |
| 3,517,356 A | 6/1970 | Hanafusa | 335/16 |
| 3,604,976 A | 9/1971 | Zajic | 315/191 |
| 3,631,369 A | 12/1971 | Menocal | 337/110 |
| 3,678,372 A | 7/1972 | Elder | 323/342 |
| 3,803,455 A | 4/1974 | Willard | 317/33 SC |
| 3,867,686 A | 2/1975 | St. Jean | 324/424 |
| 3,883,781 A | 5/1975 | Cotton | 317/14 R |
| 4,129,762 A | 12/1978 | Bruchet | 200/153 G |
| 4,144,513 A | 3/1979 | Shafer et al. | 335/46 |
| 4,157,496 A | 6/1979 | St. Jean | 324/415 |
| 4,158,119 A | 6/1979 | Krakik | 200/240 |
| 4,165,453 A | 8/1979 | Hennemann | 200/153 G |
| 4,166,988 A | 9/1979 | Ciarcia et al. | 335/9 |
| 4,220,934 A | 9/1980 | Wafer et al. | 335/16 |
| 4,255,732 A | 3/1981 | Wafer et al. | 335/16 |
| 4,259,651 A | 3/1981 | Yamat | 335/16 |

(List continued on next page.)

FOREIGN PATENT DOCUMENTS

| | | |
|---|---|---|
| BE | 819 008 A | 12/1974 |
| BE | 897 691 A | 3/1984 |
| DE | 12 27 978 | 11/1966 |

(List continued on next page.)

*Primary Examiner*—N. Le
*Assistant Examiner*—Wasseem H. Hamdan
(74) *Attorney, Agent, or Firm*—Cantor Colburn LLP

(57) ABSTRACT

A trip unit connection tester (10) is arranged to test the electrical connections (12) and (14) between a trip unit (16) and actuator (18) mounted within a circuit breaker (20). Tester (10) includes a power source (64) including a positive lead (68), and a negative lead (70). The positive lead (68) is coupled to a two-loop switch (58). The two loop switch (58) toggles between a first loop (98), and a second loop (100). The first loop (98) includes the power source (64), the two-loop switch (58), and the energy storage element (82) wherein the energy storage element (82) stores energy coming from the power source (64). The second loop (100) includes the two-loop switch (58), and the energy storage element (82), connections (12) and (14), and the actuator (18), wherein energy stored within the energy storage element (82) is released to the actuator (18).

12 Claims, 3 Drawing Sheets

U.S. PATENT DOCUMENTS

| | | | |
|---|---|---|---|
| 4,263,492 A | 4/1981 | Maier et al. | 200/288 |
| 4,276,527 A | 6/1981 | Gerbert-Gaillard et al. | 335/39 |
| 4,297,663 A | 10/1981 | Seymour et al. | 335/20 |
| 4,301,342 A | 11/1981 | Castonguay et al. | 200/153 SC |
| 4,360,852 A | 11/1982 | Gilmore | 361/98 |
| 4,368,444 A | 1/1983 | Preuss et al. | 335/166 |
| 4,375,021 A | 2/1983 | Pardini et al. | 200/147 B |
| 4,375,022 A | 2/1983 | Daussin et al. | 200/148 R |
| 4,376,270 A | 3/1983 | Staffen | 335/21 |
| 4,383,146 A | 5/1983 | Bur | 200/17 R |
| 4,392,036 A | 7/1983 | Troebel et al. | 200/322 |
| 4,393,283 A | 7/1983 | Masuda | 200/51.09 |
| 4,401,872 A | 8/1983 | Boichot-Castagne et al. | 200/153 G |
| 4,409,573 A | 10/1983 | DiMarco et al. | 335/16 |
| 4,435,690 A | 3/1984 | Link et al. | 335/37 |
| 4,467,297 A | 8/1984 | Boichot-Castagne et al. | 335/8 |
| 4,468,645 A | 8/1984 | Gerbert-Gaillard et al. | 335/42 |
| 4,470,027 A | 9/1984 | Link et al. | 335/16 |
| 4,476,511 A * | 10/1984 | Saletta et al. | 361/96 |
| 4,479,143 A | 10/1984 | Watanabe et al. | 358/44 |
| 4,488,133 A | 12/1984 | McClellan et al. | 335/16 |
| 4,492,941 A | 1/1985 | Nagel | 335/13 |
| 4,541,032 A | 9/1985 | Schwab | 361/331 |
| 4,546,224 A | 10/1985 | Mostosi | 200/153 G |
| 4,550,360 A | 10/1985 | Dougherty | 361/93 |
| 4,562,419 A | 12/1985 | Preuss et al. | 335/195 |
| 4,589,052 A | 5/1986 | Dougherty | 361/94 |
| 4,595,812 A | 6/1986 | Tamaru et al. | 200/307 |
| 4,611,187 A | 9/1986 | Banfi | 335/16 |
| 4,612,430 A | 9/1986 | Sloan et al. | 200/327 |
| 4,616,198 A | 10/1986 | Pardini | 335/16 |
| 4,622,444 A | 11/1986 | Kandatsu et al. | 200/303 |
| 4,631,625 A | 12/1986 | Alexander et al. | 361/94 |
| 4,642,431 A | 2/1987 | Tedesco et al. | 200/153 G |
| 4,644,438 A | 2/1987 | Puccinelli et al. | 361/75 |
| 4,649,247 A | 3/1987 | Preuss et al. | 200/244 |
| 4,649,455 A * | 3/1987 | Scott | 361/93 |
| 4,658,322 A | 4/1987 | Rivera | 361/37 |
| 4,672,501 A | 6/1987 | Bilac et al. | 361/96 |
| 4,675,481 A | 6/1987 | Markowski et al. | 200/144 R |
| 4,682,264 A | 7/1987 | Demeyer | 361/96 |
| 4,689,712 A | 8/1987 | Demeyer | 361/96 |
| 4,694,373 A | 9/1987 | Demeyer | 361/96 |
| 4,710,845 A | 12/1987 | Demeyer | 361/96 |
| 4,717,985 A | 1/1988 | Demeyer | 361/96 |
| 4,733,211 A | 3/1988 | Castonguay et al. | 335/192 |
| 4,733,321 A | 3/1988 | Lindeperg | 361/96 |
| 4,764,650 A | 8/1988 | Bur et al. | 200/153 G |
| 4,768,007 A | 8/1988 | Mertz et al. | 335/202 |
| 4,780,786 A | 10/1988 | Weynachter et al. | 361/87 |
| 4,803,434 A * | 2/1989 | Walker | 324/424 |
| 4,831,221 A | 5/1989 | Yu et al. | 200/553 |
| 4,833,563 A | 5/1989 | Russell | 361/92 |
| 4,870,531 A | 9/1989 | Danek | 361/93 |
| 4,883,931 A | 11/1989 | Batteux et al. | 200/148 R |
| 4,884,047 A | 11/1989 | Baginski et al. | 335/10 |
| 4,884,164 A | 11/1989 | Dziura et al. | 361/97 |
| 4,900,882 A | 2/1990 | Bernard et al. | 200/147 R |
| 4,910,485 A | 3/1990 | Bolongeat-Mobleu et al. | 335/195 |
| 4,914,541 A | 4/1990 | Tripodi et al. | 361/94 |
| 4,916,420 A | 4/1990 | Bartolo et al. | 335/172 |
| 4,916,421 A | 4/1990 | Pardini et al. | 335/185 |
| 4,926,282 A | 5/1990 | McGhie | 361/102 |
| 4,935,590 A | 6/1990 | Malkin et al. | 200/148 A |
| 4,935,839 A | 6/1990 | Lockwood | 361/230 |
| 4,937,706 A | 6/1990 | Schueller et al. | 361/396 |
| 4,939,492 A | 7/1990 | Raso et al. | 335/42 |
| 4,943,691 A | 7/1990 | Mertz et al. | 200/151 |
| 4,943,888 A | 7/1990 | Jacob et al. | 361/96 |
| 4,950,855 A | 8/1990 | Bolongeat-Mobleu et al. | 200/148 A |
| 4,951,019 A | 8/1990 | Gula | 335/166 |
| 4,952,897 A | 8/1990 | Barnel et al. | 335/147 |
| 4,956,738 A * | 9/1990 | Defosse et al. | 361/8 |
| 4,958,135 A | 9/1990 | Baginski et al. | 335/8 |
| 4,965,543 A | 10/1990 | Batteux | 335/174 |
| 4,983,788 A | 1/1991 | Pardini | 200/16 R |
| 5,001,313 A | 3/1991 | Leclerq et al. | 200/148 B |
| 5,004,878 A | 4/1991 | Seymour et al. | 200/144 R |
| 5,029,301 A | 7/1991 | Nebon et al. | 335/16 |
| 5,030,804 A | 7/1991 | Abri | 200/323 |
| 5,057,655 A | 10/1991 | Kersusan et al. | 200/148 B |
| 5,065,101 A | 11/1991 | Ledbetter | 324/418 |
| 5,077,627 A | 12/1991 | Fraisse | 361/93 |
| 5,083,081 A | 1/1992 | Barrault et al. | 324/126 |
| 5,095,183 A | 3/1992 | Raphard et al. | 200/148 A |
| 5,103,198 A | 4/1992 | Morel et al. | 335/6 |
| 5,115,371 A | 5/1992 | Tripodi | 361/106 |
| 5,120,921 A | 6/1992 | DiMarco et al. | 200/401 |
| 5,132,865 A | 7/1992 | Mertz et al. | 361/6 |
| 5,138,121 A | 8/1992 | Streich et al. | 200/293 |
| 5,140,115 A | 8/1992 | Morris | 200/308 |
| 5,153,802 A | 10/1992 | Mertz et al. | 361/18 |
| 5,155,315 A | 10/1992 | Malkin et al. | 200/148 R |
| 5,166,483 A | 11/1992 | Kersusan et al. | 200/144 A |
| 5,172,087 A | 12/1992 | Castonguay et al. | 335/160 |
| 5,178,504 A | 1/1993 | Falchi | 411/553 |
| 5,184,717 A | 2/1993 | Chou et al. | 200/401 |
| 5,187,339 A | 2/1993 | Lissandrin | 200/148 F |
| 5,198,956 A | 3/1993 | Dvorak | 361/106 |
| 5,200,724 A | 4/1993 | Gula et al. | 335/166 |
| 5,210,385 A | 5/1993 | Morel et al. | 200/146 R |
| 5,239,150 A | 8/1993 | Bolongeat-Mobleu et al. | 200/148 R |
| 5,260,533 A | 11/1993 | Livesey et al. | 200/401 |
| 5,262,744 A | 11/1993 | Arnold et al. | 335/8 |
| 5,272,438 A | 12/1993 | Stumme | 324/424 |
| 5,280,144 A | 1/1994 | Bolongeat-Mobleu et al. | 200/148 R |
| 5,281,776 A | 1/1994 | Morel et al. | 200/144 |
| 5,296,660 A | 3/1994 | Morel et al. | 200/146 R |
| 5,296,664 A | 3/1994 | Crookston et al. | 200/401 |
| 5,298,874 A | 3/1994 | Morel et al. | 335/8 |
| 5,300,907 A | 4/1994 | Nereau et al. | 335/172 |
| 5,310,971 A | 5/1994 | Vial et al. | 200/244 |
| 5,313,180 A | 5/1994 | Vial et al. | 335/16 |
| 5,317,471 A | 5/1994 | Izoard et al. | 361/105 |
| 5,331,500 A | 7/1994 | Corcoles et al. | 361/93 |
| 5,334,808 A | 8/1994 | Bur et al. | 200/50 |
| 5,341,191 A | 8/1994 | Crookston et al. | 335/16 |
| 5,347,096 A | 9/1994 | Bolongeat-Mobleu et al. | 200/148 B |
| 5,347,097 A | 9/1994 | Bolongeat-Mobleu et al. | 200/148 B |
| 5,350,892 A | 9/1994 | Rozier | 200/144 B |
| 5,357,066 A | 10/1994 | Morel et al. | 200/17 R |
| 5,357,068 A | 10/1994 | Rozier | 200/148 R |
| 5,357,394 A | 10/1994 | Piney | 361/72 |
| 5,361,052 A | 11/1994 | Ferullo et al. | 335/172 |
| 5,373,130 A | 12/1994 | Barrault et al. | 200/147 R |
| 5,379,013 A | 1/1995 | Coudert | 335/17 |
| 5,424,701 A | 6/1995 | Castonguary et al. | 335/172 |
| 5,438,176 A | 8/1995 | Bonnardel et al. | 200/400 |
| 5,440,088 A | 8/1995 | Coudert et al. | 200/303 |
| 5,449,871 A | 9/1995 | Batteux et al. | 200/401 |
| 5,450,048 A | 9/1995 | Leger et al. | 335/132 |
| 5,451,729 A | 9/1995 | Onderka et al. | 200/18 |
| 5,457,295 A | 10/1995 | Tanibe et al. | 200/293 |
| 5,459,630 A | 10/1995 | MacKenzie et al. | 361/45 |

| | | | | | | |
|---|---|---|---|---|---|---|
| 5,467,069 A | 11/1995 | Payet-Burin et al. ......... 335/42 | EP | 0 239 460 | 9/1987 |
| 5,469,121 A | 11/1995 | Payet-Burin ................. 335/16 | EP | 0 258 090 | 3/1988 |
| 5,475,558 A | 12/1995 | Barjonnet et al. ............ 361/64 | EP | 0 264 313 | 4/1988 |
| 5,476,143 A | 12/1995 | Payet-Burin ................ 335/202 | EP | 0 264 314 | 4/1988 |
| 5,477,016 A | 12/1995 | Baginski et al. ......... 200/43.11 | EP | 0 283 189 | 9/1988 |
| 5,483,212 A | 1/1996 | Lankuttis et al. ........... 335/132 | EP | 0 283 358 | 9/1988 |
| 5,485,343 A | 1/1996 | Santos et al. ............... 361/115 | EP | 0 291 374 | 11/1988 |
| D367,265 S | 2/1996 | Yamagata et al. ......... D13/160 | EP | 0 295 155 | 12/1988 |
| 5,493,083 A | 2/1996 | Olivier .................... 200/17 R | EP | 0 295 158 | 12/1988 |
| 5,504,284 A | 4/1996 | Lazareth et al. ......... 200/50 R | EP | 0 309 923 | 4/1989 |
| 5,504,290 A | 4/1996 | Baginski et al. ........... 200/401 | EP | 0 313 106 | 4/1989 |
| 5,510,761 A | 4/1996 | Boder et al. ................ 335/172 | EP | 0 313 422 | 4/1989 |
| 5,512,720 A | 4/1996 | Coudert et al. ............ 200/400 | EP | 0 314 540 | 5/1989 |
| 5,515,018 A | 5/1996 | DiMarco et al. .............. 335/16 | EP | 0 331 586 | 9/1989 |
| 5,519,561 A | 5/1996 | Mrenna et al. ............ 361/105 | EP | 0 337 900 | 10/1989 |
| 5,534,674 A | 7/1996 | Steffens ...................... 218/154 | EP | 0 342 133 | 11/1989 |
| 5,534,832 A | 7/1996 | Duchemin et al. ............ 335/16 | EP | 0 367 690 | 5/1990 |
| 5,534,835 A | 7/1996 | McColloch et al. ........ 335/172 | EP | 0 371 887 | 6/1990 |
| 5,534,840 A | 7/1996 | Cuingnet ........................ 337/1 | EP | 0 375 568 | 6/1990 |
| 5,539,168 A | 7/1996 | Linzenich .................. 200/303 | EP | 0 394 144 | 10/1990 |
| 5,543,595 A | 8/1996 | Mader et al. ............... 200/401 | EP | 0 394 922 | 10/1990 |
| 5,552,755 A | 9/1996 | Fello et al. ................... 335/18 | EP | 0 399 282 | 11/1990 |
| 5,581,219 A | 12/1996 | Nozawa et al. ............. 335/132 | EP | 0 407 310 | 1/1991 |
| 5,604,656 A | 2/1997 | Derrick et al. .............. 361/187 | EP | 0 452 230 | 10/1991 |
| 5,608,367 A | 3/1997 | Zoller et al. ................ 335/172 | EP | 0 555 158 | 8/1993 |
| 5,784,233 A | 7/1998 | Bastard et al. ................ 361/36 | EP | 0 560 697 | 9/1993 |
| 5,825,643 A | 10/1998 | Dvorak et al. ................ 756/12 | EP | 0 567 416 | 10/1993 |
| 5,856,710 A | 1/1999 | Baughman et al. ........ 307/10.1 | EP | 0 595 730 | 5/1994 |
| 6,262,872 B1 * | 7/2001 | Messerli et al. ........... 361/93.2 | EP | 0 619 591 | 10/1994 |
| | | | EP | 0 665 569 | 8/1995 |
| FOREIGN PATENT DOCUMENTS | | | EP | 0 700 140 | 3/1996 |
| DE | 30 47 360 | 6/1982 | EP | 0 889 498 | 1/1999 |
| DE | 38 02 184 | 8/1989 | FR | 2 410 353 | 6/1979 |
| DE | 38 43 277 | 6/1990 | FR | 2 512 582 | 3/1983 |
| DE | 44 19 240 | 1/1995 | FR | 2 553 943 | 4/1985 |
| EP | 29 41 505 A | 4/1981 | FR | 2 592 998 | 7/1987 |
| EP | 0 061 092 | 9/1982 | FR | 2 682 531 | 4/1993 |
| EP | 0 064 906 | 11/1982 | FR | 2 697 670 | 5/1994 |
| EP | 0 066 486 | 12/1982 | FR | 2 699 324 | 6/1994 |
| EP | 0 076 719 | 4/1983 | FR | 2 714 771 | 7/1995 |
| EP | 0 117 094 | 8/1984 | GB | 2 233 155 | 1/1991 |
| EP | 0 140 761 | 5/1985 | RU | 1 227 978 | 4/1986 |
| EP | 0 174 904 | 3/1986 | WO | 92/00598 | 1/1992 |
| EP | 0 196 241 | 10/1986 | WO | 92/05649 | 4/1992 |
| EP | 0 224 396 | 6/1987 | WO | 94/00901 | 1/1994 |
| EP | 0 235 479 | 9/1987 | | | |

* cited by examiner

CONNECTION TESTER FOR AN ELECTRONIC TRIP UNIT

CROSS REFERENCE TO RELATED APPLICATIONS

This application is a continuation of Ser. No 09/521,493, filed Mar. 9, 2000, now U.S. Pat. No. 6,429,659 B1, patented on Aug. 6, 2002, which is hereby incorporated by reference in its entirety.

BACKGROUND OF INVENTION

The present invention generally relates to a method and apparatus for testing electronic trip units. More specifically, the present invention relates to a tester for suitably testing the connection between a trip unit and an actuator within a circuit breaker, and a method and circuit breaker usable with the tester.

A circuit breaker typically includes a pair of electrical contacts that, when closed, allows circuit current to pass to a protected portion of an electrical distribution circuit via the closed contacts. When the contacts open, circuit current is prevented from flowing from one contact member to the other, and therefore, circuit current is prevented from flowing to the protected portion of the distribution circuit. The use of electronic trip units (trip units) in such circuit breakers is well known.

An electronic trip unit typically comprises voltage and current sensors, which provide analog signals indicative of the current flowing through the circuit breaker to a protected portion of an electrical distribution circuit. The analog signals are converted by an A/D (analog/digital) converter to digital signals, which are processed by a microcontroller. The trip unit further includes RAM (random access memory), ROM (read only memory) and EEPROM (electronic erasable programmable read only memory) all of which interface with the microcontroller. The ROM includes trip unit application code, e.g., main functionality firmware, including initializing parameters, and boot code. The EEPROM includes operational parameters for the application code.

In response to an overcurrent condition in the electrical distribution circuit, the electronic trip unit generates a trip signal, which is provided to an actuator within the circuit breaker. In response to the trip signal, the actuator, which includes a solenoid or similar electromechanical device, mechanically actuates (trips) an operating mechanism within the circuit breaker. The operating mechanism separates the electrical contacts to stop the flow of electrical current to the protected circuit.

The electronic trip unit and the actuator are typically separate components mounted within the circuit breaker's housing. Thus, when a circuit breaker is assembled, an electrical connection must be established between the electronic trip unit and the actuator. This connection is made within the circuit breaker housing and is, therefore, not visible when the circuit breaker housing is fully assembled. Operability of the circuit breaker depends upon the electrical connection between the trip unit and the actuator. Therefore, this connection must be checked during initial circuit breaker construction and periodically through the life of the circuit breaker. Unfortunately, a visual check can be made only by partially disassembling the circuit breaker, which increases construction and maintenance costs.

SUMMARY OF INVENTION

The above discussed and other drawbacks and deficiencies are overcome or alleviated by a circuit breaker having a housing, a trip unit within the housing, an actuator electrically connected to said trip unit, a first terminal and a second terminal, the circuit breaker adapted to connect to an electrical distribution circuit through the first terminal and the second terminal, a test jack provided on the housing, a jack terminal separate from the first terminal and the second terminal provided within the test jack, the jack terminal electrically connected to an electrical connection between the actuator and the trip unit, wherein the electrical connection between the actuator and the trip unit can be tested without disassembling the circuit breaker.

A method for testing an electrical connection between a trip unit and an actuator within a circuit breaker is also disclosed, where the circuit breaker includes a first terminal and a second terminal for connecting the circuit breaker to an electrical distribution circuit, and a test jack housing a jack terminal, the jack terminal separate from the first and second terminals, the jack terminal electrically connected to the trip unit. The method includes plugging a plug of a tester within the test jack of the circuit breaker, the tester also having a casing, the plug extending from the casing, a power source, an energy storage element electrically connected to the power source, and a two loop switch electrically connected to the power source and the energy storage element. The method also includes charging the energy storage element within the tester by positioning the two loop switch in a charge position, and releasing energy from the energy storage element in the tester to the actuator in the circuit breaker through the electrical connection, wherein releasing energy from the energy storage element in the tester includes positioning the two loop switch in a discharge position.

BRIEF DESCRIPTION OF DRAWINGS

The present invention will now be described, by way of an example, with references to the accompanying drawings, in which.

DETAILED DESCRIPTION

Figure 1:
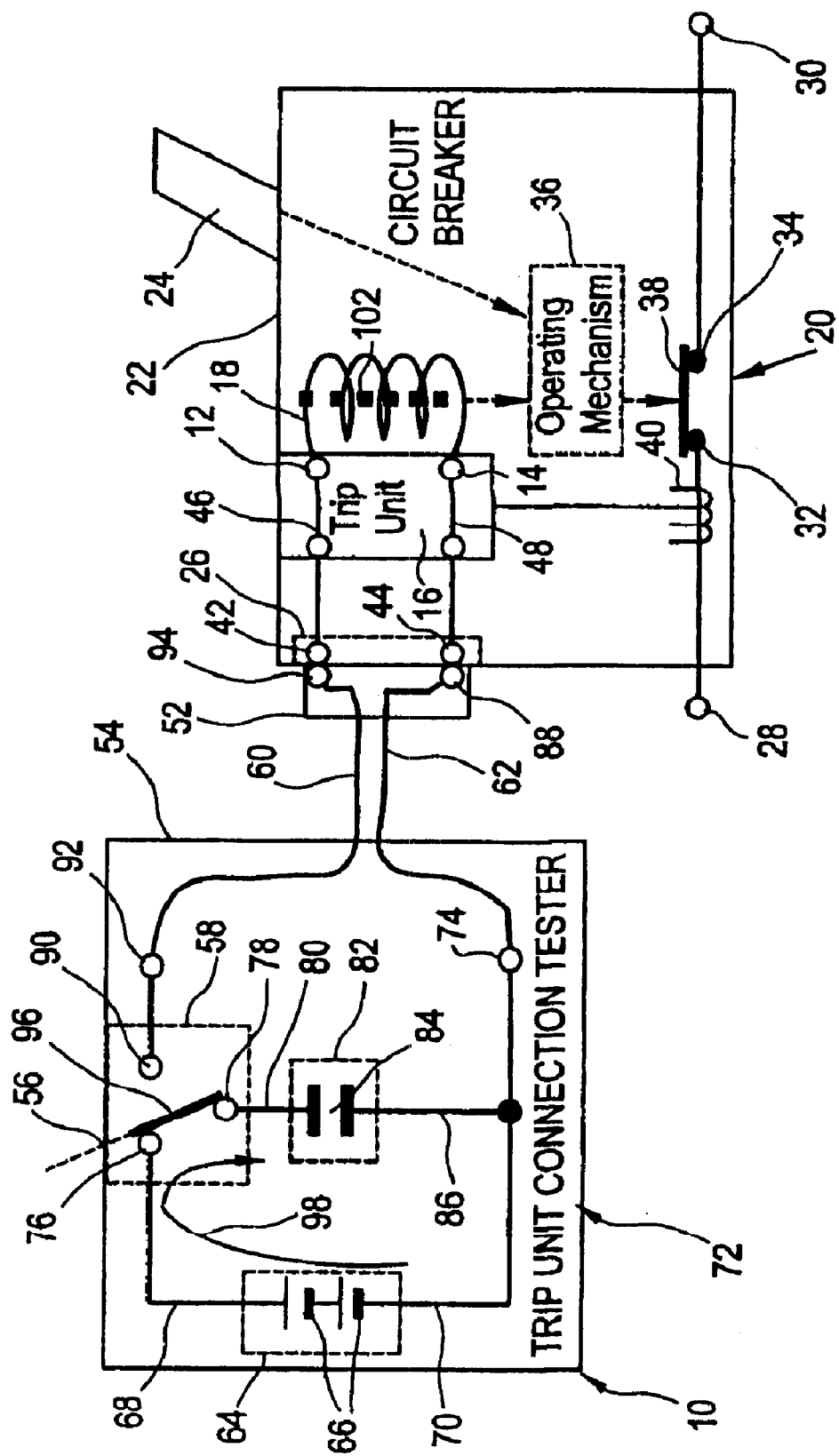
FIG. 1 is a schematic diagram showing the trip unit connection tester of the present invention in a charge position.

Referring to FIG. 1, a trip unit connection tester, generally shown at 10, is arranged to test the electrical connections 12 and 14 between a trip unit 16 and actuator 18 mounted within a circuit breaker 20.

Circuit breaker 20 includes an electrically insulative housing 22 with a handle 24 extending therefrom and a test jack recess 26 disposed therein. Circuit breaker 20 is configured to connect to an electrical distribution circuit (not shown) via terminals 28 and 30. Disposed on terminals 28 and 30, respectively, are stationary contacts 32 and 34, which are mounted within housing 22. Also mounted within housing 22 is an operating mechanism 36, which is operatively linked to a movable contact 38. Operating mechanism 36 is a mechanical linkage arranged to position movable contact 38 into electrical contact with stationary contacts 32 and 34 (i.e. close the contacts) to allow the flow of electrical current to a protected load (not shown) or a protected portion of the electrical distribution circuit (not shown). Operating mechanism 36 is also arranged to position movable contact 38 out of electrical contact with stationary contacts 32 and 34 (i.e. open the contacts) to stop the flow of electrical current to a protected load (not shown) or a protected portion of the electrical distribution circuit (not shown). Handle 24 interacts with the operating mechanism 36 to allow the manual opening or closing of contacts 32, 34, and 38.

Electronic trip unit 16 is arranged within circuit breaker housing 22. Trip unit 16 receives a signal indicative of electrical current within terminal 28 via a current sensor 40, which is disposed proximate to terminal 28. If the current indicated by this signal is above a predetermined threshold, an overcurrent condition exists in the electrical distribution circuit. In response to such an overcurrent condition, trip unit 16 provides a trip signal to actuator 18 via connections 12 and 14. An example of such a trip unit is described in U.S. Pat. No. 4,589,052, which is incorporated herein by reference.

Actuator 18 is a solenoid or similar electromechanical device electrically connected to trip unit 16 at connections 12 and 14. Actuator 18 is arranged to activate operating mechanism 36 in response to receiving the trip signal from trip unit 16. Upon activation by actuator 18, operating mechanism opens contacts 32, 34, and 38 to stop the flow of electrical current to the protected load or the protected portion of the distribution circuit.

Test jack recess 26 is formed in housing 22 and includes jack terminals 42 and 44 mounted therein. Extending from jack terminal 42 is a conductive lead 46, which is electrically connected to connection 12. Extending from jack terminal 44 is a conductive lead 48, which is electrically connected to connection 14. Test jack 26 is configured to accept a test plug 52, which extends from the trip unit connection tester 10.

Trip unit connection tester 10 includes a hand-held casing 54 with test plug 52 and an operative portion 56 of a switch 58 extending therefrom. Test plug 52 is attached to casing 54 by insulated wires 60 and 62. Mounted within casing 54 is a power source 64 such as a battery 64 (e.g. a nine volt battery) or group of batteries 66 having a positive lead 68 and a negative lead 70. Power source 64 forms part of a test circuit 72 within casing 54.

In test circuit 72, the negative lead 70 of power source 64 is coupled to a common lead 74. The positive lead 68 is coupled to a first terminal 76 of the single pole double throw two-loop switch 58. A common terminal 78 of the single pole double throw two-loop switch 58 is coupled to a first end 80 of an energy storage element 82 such as a capacitor 84. A second end 86 of the energy storage element 82 is coupled to common lead 74. From the negative lead 70 and the second end 86 of the energy storage element 82 emerge the common lead 74 of the tester 10. Insulated wire 62 is attached to common lead 74. Insulated wire 62 extends external to tester housing 54 to a plug terminal 88 within plug 52. Plug terminal 88 is releasably engaged by jack terminal 44 to form an electrical connection therebetween. The single pole double throw two-loop switch 58 has a second terminal 90 that is connected to a second lead 92 of the tester 10. Insulated wire 60 is attached to second lead 92. Insulated wire 60 extends external to tester housing 54 to a plug terminal 94 within plug 52. Plug terminal 94 is releasably engaged by jack terminal 42 to form an electrical connection therebetween.

Figure 2:
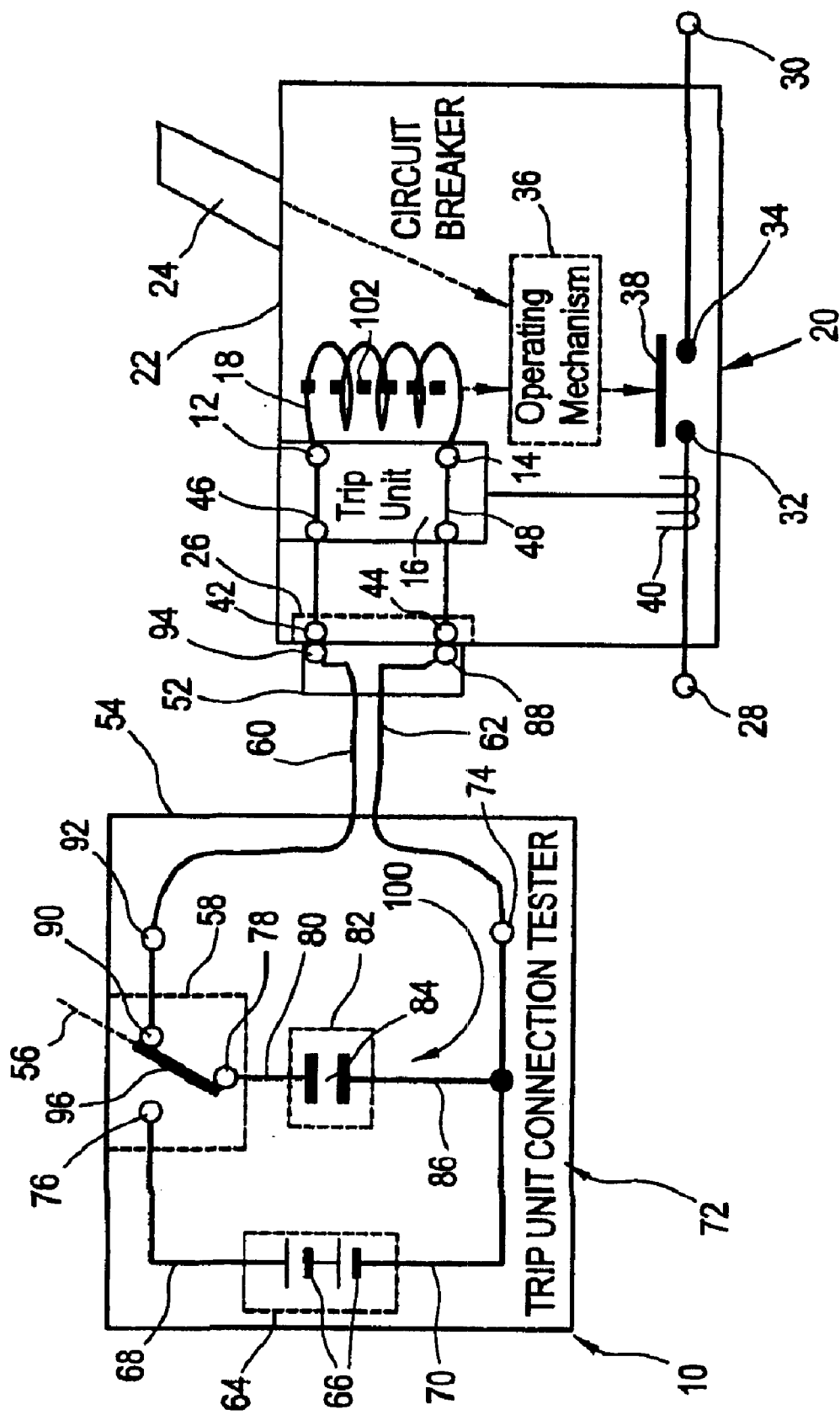
FIG. 2 is a schematic diagram showing the trip unit connection tester of FIG. 1 in a discharge position.

One operation of the tester 10 comprises two operational states. A first state (charge position) is shown in FIG. 1, wherein a contact 96 of the single pole double throw two loop switch 58 is in contact with the first terminal 76 and the common terminal 78. Thus, a first loop (circuit) 98 is formed whereby the power source 64 charges the energy storage element 82 within a specified time interval. The energy storage element 82 stays charged as long as the first loop 98 is closed. A second state (discharge position), shown in FIG. 2, is as follows. The contact 96 of the single pole double throw two-loop switch 58 is in contact with the second terminal 90 and the common terminal 78. Thus, a loop (circuit) 100 is formed comprising the energy storage element 82, the common terminal 74, the contact 96, the second terminal 90, the second lead 92, the terminals 94 and 42, lead 46 and connection 12. The loop 100 further comprises the actuator 18 having a first end coupled to the connection 12 and a second end coupled to connection 14. Connection 14 is coupled to lead 48. Lead 48 is connected to wire 62 via terminals 44 and 88. When the contact 96 flips over to that of the second terminal 90 the loop 100 is completed. The completed loop 100 causes the stored energy within the energy storage element 82 to release energy stored therein. The released energy flows through the actuator 18. If connections 12 and 14 between the trip unit 16 and the actuator 18 are properly established within the circuit breaker, the energy released by the energy storage element 82 will be received by the actuator 18. Actuator 18 will then cause movement of a solenoid element 102 contained within the actuator 18 and thereby activate the operating mechanism 36. The use of energy storage element 82 allows the passage of a sufficient amount of energy to test the actuator 18, while ensuring that the amount of energy provided will not damage the actuator 18 or any of the circuitry.

Trip unit connection tester 10 allows connections 12 and 14 to be tested without disassembling circuit breaker 20. Testing is performed by inserting plug 52 into jack 26 so that a connection is established between terminals 42 and 94 and between terminals 44 and 88. The operative portion 56 of switch 58 is then moved to the discharge position (FIG. 2). If the breaker trips (i.e. contacts 32, 34, and 38 separate) then the connections 12 and 14 are good. If the breaker 20 does not trip, then the trip unit 16 and actuator 18 are not properly connected. Trip unit connection tester 10 provides a low cost, hand held tester that can be operated by a common power source 64. Because connections 12 and 14 can be tested without disassembling the circuit breaker 20, the trip unit connection tester 10 saves construction and maintenance costs.

Figure 3:
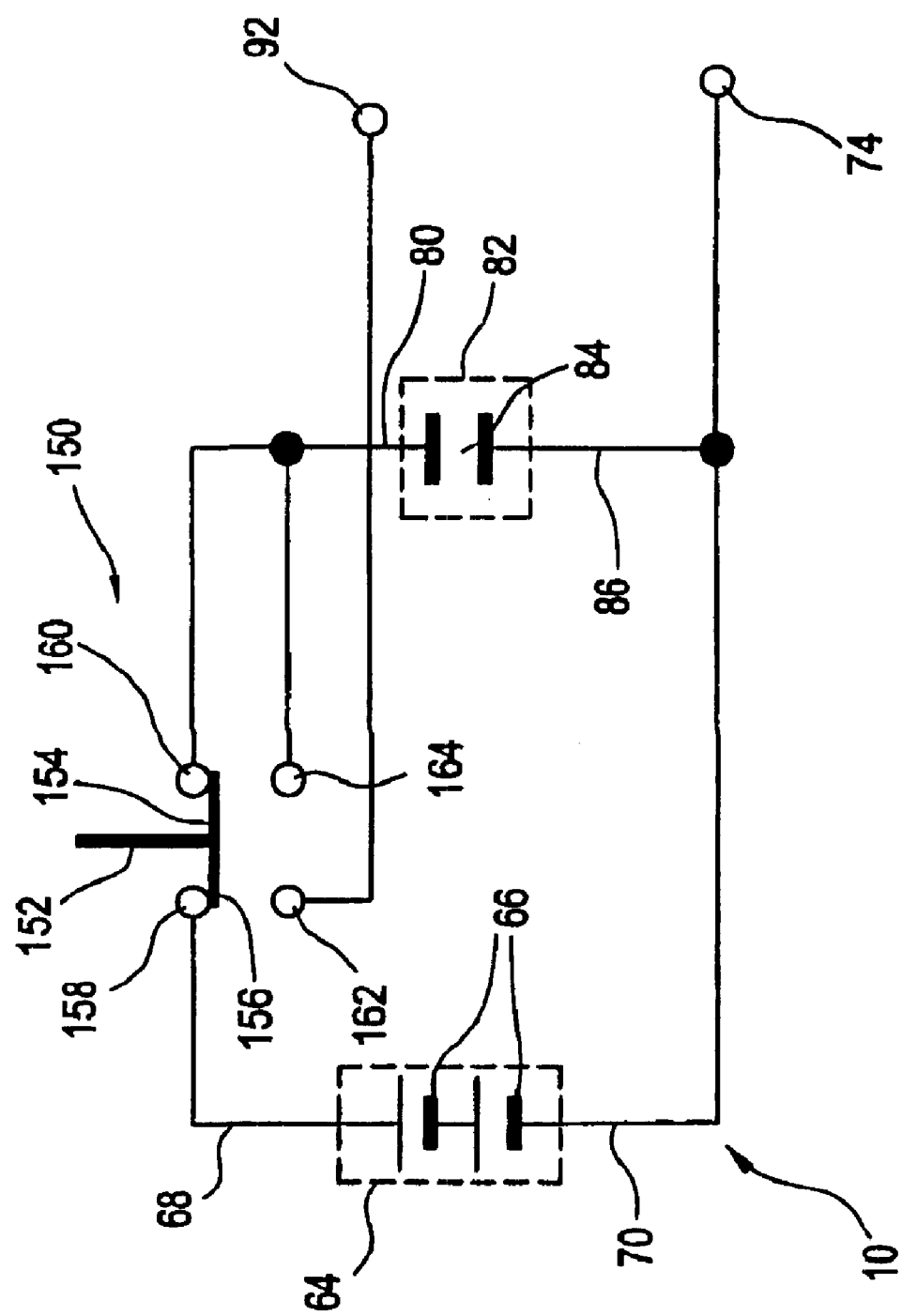
FIG. 3 is a schematic diagram showing an alternative embodiment of the trip unit connection tester of the present invention in a charge position.

Referring to FIG. 3, a second embodiment of the instant invention is described. More specifically, a second embodiment of the trip unit connection tester 10 is described where the single pole double throw two loop switch 58 is replaced with a plunger type switch 150. In this embodiment, a plunger 152 has two conducting surfaces, a first surface 154 and a second surface 156. In other words, a double make, double break contact on arm 152 is used as a contact for the instant invention. The contact has the first surface 154 and a second surface 156. The positive lead 68 of the power source 64 is coupled to a first terminal 158 having a first contact (not shown), and the first end 80 of an energy storage element 82 is coupled to a second terminal 160 having a second contact (also not shown). The double break contact on arm 152 can come in electric connection with the first and second contacts by way of having the first surface 154 in direct contact with the first and second contacts. Furthermore, the second end 86 of the energy storage element 82, and the negative lead 70 of the power source 64 are coupled together. In other words, the first loop 98 (FIG. 1) is closed when the double break contact on arm 152 can come in electric connection with the first and second contacts by way of having the first surface 154 in direct contact with the first and second contacts. The second lead 92 is coupled to a third terminal 162 having a third contact (not shown). The first end 80 of an energy storage element 82 is also coupled to a fourth terminal 164 having a fourth contact (also not shown). In addition, the negative lead 70 of the power source 64 and the second end 86 are coupled together, as well as coupled to the first lead 74 of the tester 10. The double break contact arm 152 can come in electric connection with the third and fourth contacts by way of having the second surface 156 in direct contact with the third and fourth contacts. In other words, the second loop 100 (FIG. 2) is closed when the double break contact on arm 152 can come in electric connection with the third and fourth contact by way of having the second surface 156 in direct contact with the third and fourth contacts.

Furthermore, it can be appreciated the instant invention further includes a method for trip unit actuator testing system, which includes charging an energy storage element 82, as well as releasing energy from the energy storage element 82 upon a load.

It will be understood that a person skilled in the art may make modifications to the preferred embodiment shown herein within the scope and intent of the claims. While the present invention has been described as carried out in a specific embodiment thereof, it is not intended to be limited thereby but intended to cover the invention broadly within the scope and spirit of the claims.

What is claimed is:

1. A method for testing an electrical connection between a trip unit and an actuator within a circuit breaker, the circuit breaker comprising a first terminal and a second terminal for connecting the circuit breaker to an electrical distribution circuit, the circuit breaker further comprising a test jack housing a jack terminal, the jack terminal separate from the first and second terminals, the jack terminal electrically connected to the trip unit, the method comprising:

plugging a plug of a tester within the test jack of the circuit breaker, the tester further comprising a casing, the plug extending from the casing, a power source, an energy storage element electrically connected to the power source, and a two loop switch electrically connected to the power source and the energy storage element;

charging the energy storage element within the tester by positioning the two loop switch in a charge position; and releasing energy from said energy storage element in the tester to said actuator in the circuit breaker through the electrical connection, wherein releasing energy from said energy storage element in the tester comprises positioning the two loop switch in a discharge position.

2. The method of claim 1, further including:
    providing a capacitor as an energy storage element.

3. The method of claim 1, further comprising:
    providing a battery for said charging an energy storage element.

4. The method of claim 1 further comprising observing the circuit breaker and determining if the circuit breaker has been tripped subsequent releasing energy from said energy storage element to said actuator.

5. The method of claim 4 further comprising repairing the electrical connection between the trip unit and the actuator if the circuit breaker did not trip subsequent releasing energy from said energy storage element to said actuator.

6. A circuit breaker comprising:
    a housing;
    a trip unit within the housing;
    an actuator electrically connected to said trip unit;
    a first terminal and a second terminal, the circuit breaker adapted to connect to an electrical distribution circuit through the first terminal and the second terminal;
    a stationary contact connected to the first terminal;
    a movable contact movable in and out of electrical contact with the stationary contact;
    a test jack provided on the housing, a jack terminal separate from the first terminal and the second terminal provided within the test jack, the jack terminal electrically connected to an electrical connection between the actuator and the trip unit, wherein the electrical connection between the actuator and the trip unit can be tested without disassembling the circuit breaker, and further wherein the movable contact is moved out of electrical contact from the stationary contact when energy is received through the jack terminal and when the trip unit and the actuator are properly connected through the electrical connection.

7. The circuit breaker of claim 6 wherein the test jack includes a pair of jack terminals and a pair of electrical connections between the actuator and the trip unit, each jack terminal connected by a connecting lead to one of the electrical connections.

8. The circuit breaker of claim 6 wherein the actuator includes a solenoid element.

9. The circuit breaker of claim 8 wherein a first end of the solenoid element is connected to a first electrical connection between the actuator and the trip unit and a second end of the solenoid element is connected to a second electrical connection between the actuator and the trip unit.

10. The circuit breaker of claim 6 wherein the housing includes a recess, the test jack provided within the recess.

11. The circuit breaker of claim 6 wherein the actuator is arranged to activate an operating mechanism in response to receiving a trip signal from the trip unit.

12. A circuit breaker comprising:
    a housing;
    a trip unit within the housing;
    an actuator electrically connected to said trip unit; wherein the actuator includes a solenoid element; wherein a first end of the solenoid element is connected to a first electrical connection between the actuator and the trip unit and a second end of the solenoid element is connected to a second electrical connection between the actuator and the trip unit;
    a first terminal and a second terminal, the circuit breaker adapted to connect to an electrical distribution circuit through the first terminal and the second terminal;
    a test jack provided on the housing, a jack terminal separate from the first terminal and the second terminal provided within the test jack, the jack terminal electrically connected to the first and second electrical connections between the actuator and the trip unit, wherein the electrical connection between the actuator and the trip unit can be tested without disassembling the circuit breaker.

* * * * *